(12) United States Patent
Du

(10) Patent No.: US 7,307,846 B2
(45) Date of Patent: Dec. 11, 2007

(54) SLIDING COVER FOR SLOT OF ELECTRONIC DEVICE

(75) Inventor: Yu-Jen Du, Taipei (TW)

(73) Assignee: Inventec Corporation (TW)

( * ) Notice: Subject to any disclaimer, the term of this patent is extended or adjusted under 35 U.S.C. 154(b) by 68 days.

(21) Appl. No.: 11/184,901

(22) Filed: Jul. 20, 2005

(65) Prior Publication Data

US 2007/0019389 A1    Jan. 25, 2007

(51) Int. Cl.
*H05K 7/16* (2006.01)
(52) U.S. Cl. ............... 361/728; 361/727; 361/756
(58) Field of Classification Search ......... 361/756, 361/727, 686, 741, 802, 752; 439/377
See application file for complete search history.

(56) References Cited

U.S. PATENT DOCUMENTS

| | | | | |
|---|---|---|---|---|
| 3,362,564 A | * | 1/1968 | Mueller | 220/345.3 |
| 4,997,103 A | * | 3/1991 | Daly | 220/345.3 |
| 5,199,888 A | * | 4/1993 | Condra et al. | 439/142 |
| 5,331,506 A | * | 7/1994 | Nakajima | 361/683 |
| 5,574,625 A | * | 11/1996 | Ohgami et al. | 361/684 |
| 5,627,450 A | * | 5/1997 | Ryan et al. | 361/686 |
| 5,757,616 A | * | 5/1998 | May et al. | 361/683 |
| 6,398,327 B1 | * | 6/2002 | Momoze | 312/319.1 |
| 6,510,960 B1 | * | 1/2003 | Christopherson et al. | 220/345.3 |

* cited by examiner

*Primary Examiner*—Tuan T. Dinh
*Assistant Examiner*—Hung S Bui
(74) *Attorney, Agent, or Firm*—Bacon & Thomas, PLLC

(57) ABSTRACT

The present invention is to provide an electronic device comprising a case including one or more connections disposed on a front panel thereof, a transverse groove disposed along the front panel and above one of the connections, and a transverse rail disposed on the front panel and below one of the connections; and a sliding cover including a plurality of latches disposed on a top edge thereof, and a slide disposed on a bottom edge thereof and extended toward the connections, wherein the latches are slidably secured to the groove, the slide is adapted to slidably receive the rail for completing an assembly of the sliding cover, and the sliding cover is adapted to transversely slide along the groove for covering one of the connections or not.

1 Claim, 4 Drawing Sheets

SLIDING COVER FOR SLOT OF ELECTRONIC DEVICE

FIELD OF THE INVENTION

The present invention relates to a protection device of an electronic device and more particularly to such an electronic device having connections being protected by a sliding cover so as to protect the connections from being polluted by dust and foreign objects and prolong the useful life thereof.

BACKGROUND OF THE INVENTION

A wide variety of portable digital devices (e.g., notebooks, PDAs (personal digital assistants), etc.) are commercially available in a fast pace in recent years as network and communication technologies advance. Moreover, such digital devices are inexpensive, compact, and easy to carry. They not only fulfill the needs of people in wireless communication in our daily life and work but also fulfill the needs of people in entertainment and data processing. For example, a variety of video games and database software packages are commercially available. Thus, people have more changes to use the portable devices. Particularly, in the bustling city life such portable devices have become a ubiquitous tool for both personal and work related tasks in our daily life.

Moreover, currently available portable devices are provided with many additional advanced features as compared with their prototypes due to rapid progress of industry of the art. Also, the additional advanced features have become standard features of the portable devices. This is the development trend of such products.

Following is a detailed description of an available portable electronic device such as notebook as an example.

Referring to FIG. 1, a notebook 10 as shown in its open position comprises a parallelepiped case 11, a keyboard 12 on a top surface of the case 11 wherein a user may enter data through the keyboard 12, a touch pad 13 on the top surface of the case 11 below the keyboard 12, the touch pad 13 served to replace a typical mouse, a plurality of ports 14 on a front panel of the case 11, each of the ports 14 adapted to connect to the connector of a peripheral device (e.g., adaptor of digital camera, flash disk, earphone, microphone, etc.), at least one slot 15 (one is shown) on the front panel of the case 11 adjacent the ports 14, the slot 15 adapted to receive an inserted component (e.g., memory card) having a conformed size, a hinge 16 at a rear edge of the case 11, and a display 17 adapted to connect to the case 11 by the hinge 16. Thus, the display 17 is adapted to pivot to either rest upon the case 11 for closing the notebook 10 or dispose away from the case 11 for opening the notebook 10 for operating.

In one design of manufacturers shown above, the ports 14 and the slot 15 are exposed on the front panel of the case 11. In another design an additional protection member (not shown) is formed on the ports 14 and the slot 15. However, the provision of the protection member not only increases the manufacturing cost but also complicates the construction. Ideally, the protection member should be an integral part of the case 11 in a nonoperating position such that an aesthetic appearance of the case 11 can be obtained. Most importantly, the protection member is designed to prevent dust, foreign objects, etc. from entering the case 11 so as to prolong the useful life of the ports 14 and the slot 15. Otherwise, an owner of the notebook 10 may suffer great financial loss. Unfortunately, the typical configuration with both the ports 14 and the slot 15 being exposed from the case 11 definitely cannot prolong its useful life.

Users are more rational and industry of the art is also mature as time evolves. Thus, users are more critical to the practicability of the portable devices. In addition to the advancement of technology and the expansion of functionality, durability and affordable price are also factors under consideration in buying the product. Thus, many manufacturers of the portable device have made progress in practicability of the product in order to own a great share of the market and thus bring great protection to vast users.

In view of the above and the fact that features of a portable device produced by one manufacturer have little difference with respect to that of a similar portable device produced by another manufacturer, it is concluded that uniqueness of the product is the key to survive in this competitive market. Thus, continuing improvements in the exploitation of a sturdy, aesthetic, and durable electronic device without the above drawbacks are constantly being sought by the manufacturers in the art in order to enhance competitiveness of the product in the market.

SUMMARY OF THE INVENTION

After understanding the needs of the market and vast users and considerable research and experimentation, a sliding cover for slot of electronic device according to the present invention has been devised by the present inventor so as to overcome the above drawbacks of the prior art, i.e., in one design the ports and the slot of the case are exposed on a front panel thereof, however, this cannot prevent dust, foreign objects, etc. from entering the case and thus the useful life is shortened, in another design an additional protection member is formed on the ports and the slot, and however, the protection member not only increases the manufacturing cost but also complicates the construction.

It is an object of the present invention to provide an electronic device comprising a case including one or more connections disposed on a front panel thereof, a transverse groove disposed along the front panel of the case and above one of the connections, and a transverse rail disposed on the front panel of the case and below one of the connections; and a sliding cover including a plurality of latches disposed on a top edge thereof, and a slide disposed on a bottom edge thereof, the slide extended toward the connections, wherein the latches are slidably secured to the groove, the slide is adapted to slidably receive the rail for completing an assembly of the sliding cover, and the sliding cover is adapted to transversely slide along the groove for covering the opening of one of the connections or not. By utilizing this sliding cover, not only the useful life of the connections (e.g., slot and ports) is prolonged but also drawbacks of the connections of the prior electronic device (e.g., notebook) are eliminated. The drawbacks include the ports and the slot on the case of the electronic device being exposed on a front panel thereof, dust, foreign objects, etc entered the case, and thus the useful life of the connections being shortened.

In one aspect of the present invention there are further provided a protuberance disposed on the front panel of the case proximate the connections and spaced from one side of one of the connections, two spaced projections disposed on the sliding cover facing the protuberance, either projection being adapted to lockingly engage the protuberance when the sliding cover is disposed either in a first position to cover the slot or in a second position to expose the slot by sliding, and a protrusion disposed under either latch, and wherein the protrusions are adapted to cooperate with the projections such that a structural strength of the sliding cover can be enhanced, and the projection and the protrusion are adapted to facilitate grasping and sliding of the sliding cover by the hand.

The above and other objects, features and advantages of the present invention will become apparent from the following detailed description taken with the accompanying drawings.

DETAILED DESCRIPTION OF THE PREFERRED EMBODIMENTS

Figure 1:
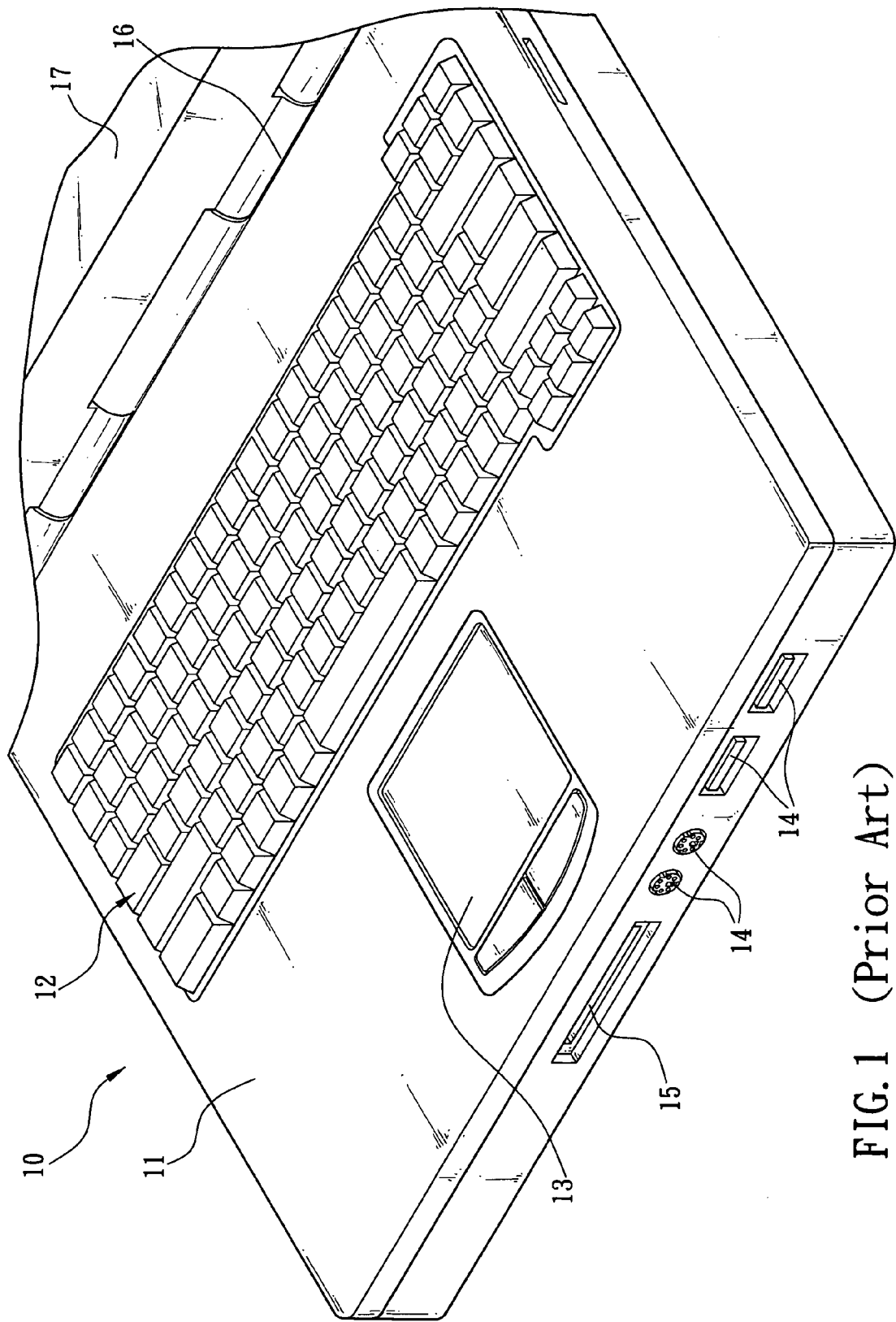
FIG. 1 is a perspective view of a conventional electronic device (e.g., notebook) in its open position.
Figure 2:
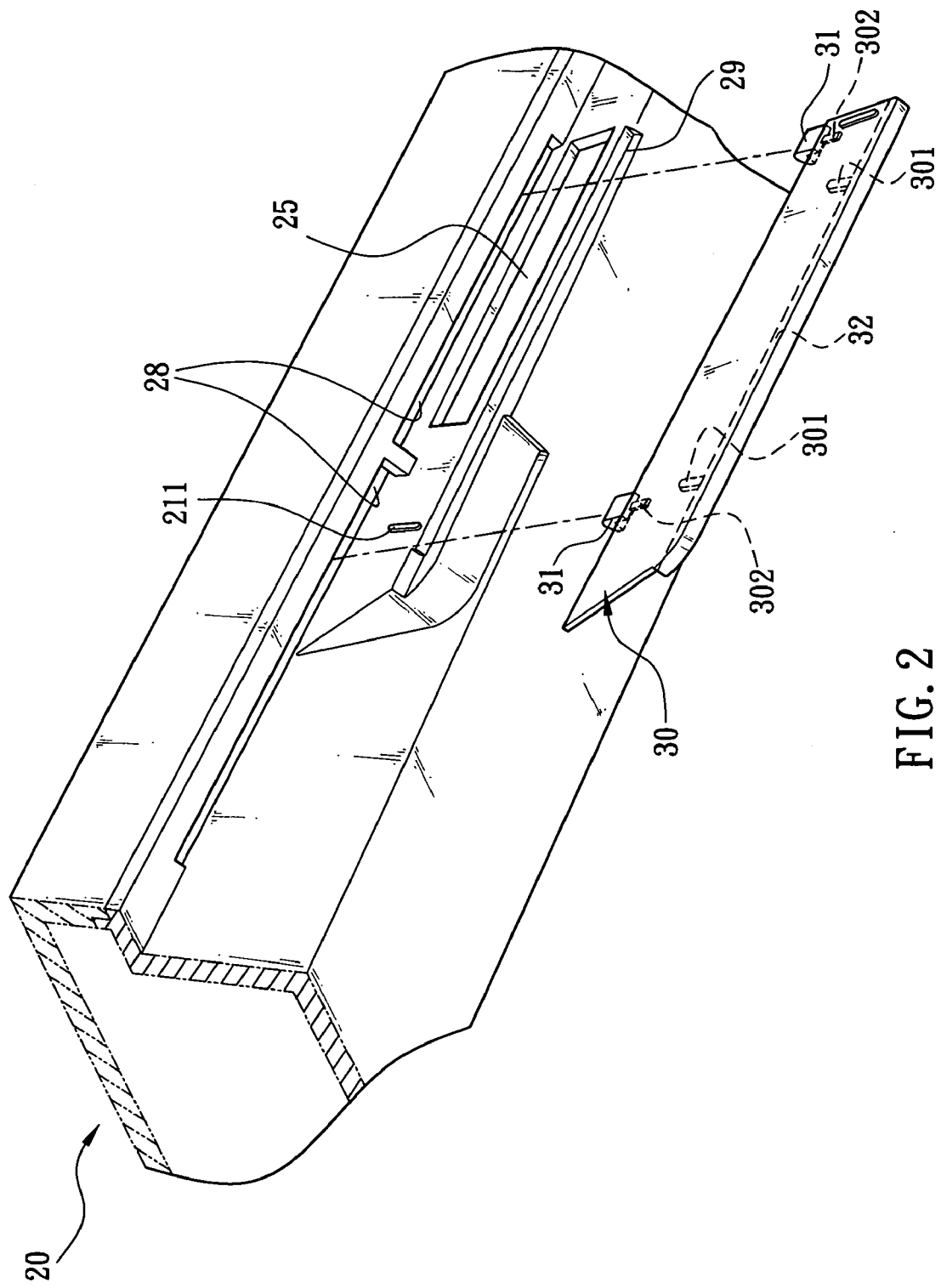
FIG. 2 is an exploded view of a preferred embodiment of sliding cover to be mounted on a slot on a front panel of case of an electronic device (e.g., notebook) according to the invention.
Figure 3:
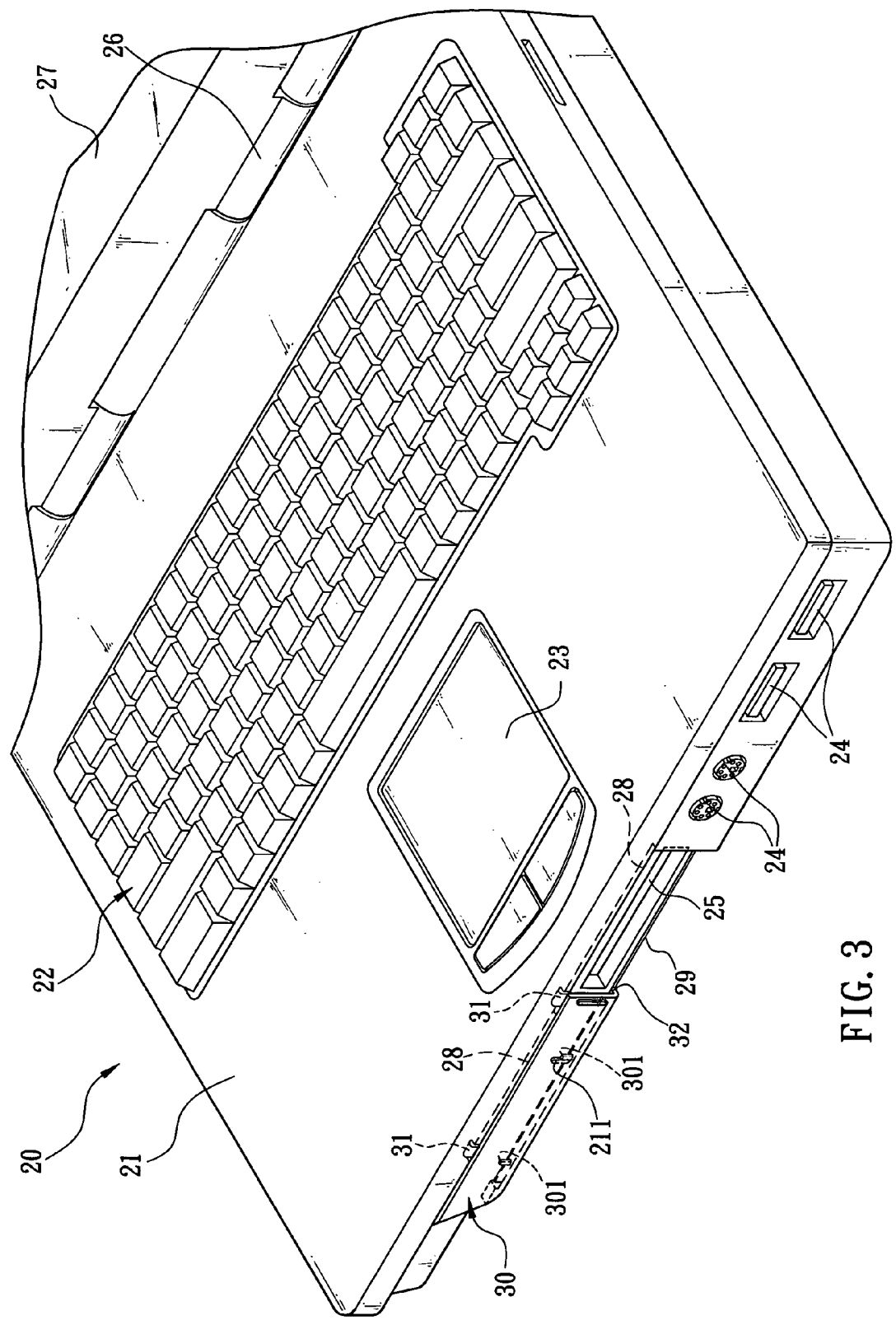
FIGS. 3 and 4 are perspective views of the open electronic device with the slot being shown not covered and covered by the sliding cover respectively.

Referring to FIGS. 2 and 3, a preferred embodiment of the invention is shown. The preferred embodiment comprises an electronic device 20 and a sliding cover 30. In the embodiment the electronic device 20 is a notebook. The notebook 20 comprises a parallelepiped case 21 hingedly connected to a display 27 by a hinge 26 (see FIG. 3). Thus, the display 27 is adapted to pivot to either rest upon the case 21 for closing the notebook 20 or dispose away from the case 21 for opening the notebook 20 for operating. A keyboard 22 is provided on a top surface of the case 21 such that a user may enter data through the keyboard 22. A touch pad 23 is provided on the top surface of the case 21 below the keyboard 22, the touch pad 23 served to replace a typical mouse. A plurality of connections are provided on a front panel of the case 21. The connections are implemented as at least one port 24 (four are shown) and at least one slot 25 (one is shown). Each port 24 is implemented as a USB (universal serial bus), RS232, or the like and is adapted to connect to the connector of a peripheral device (e.g., adaptor of digital camera, flash disk, earphone, microphone, etc.) Each slot 25 is adapted to receive an inserted component (e.g., memory card) having a conformed size.

Moreover, a transverse groove 28 is formed along a shoulder of a front panel of the case 21 above one of the connections. The groove 28 has one end terminated at the connections. A transverse rail 29 is formed below one of the connections. In the embodiment, the groove 28 and the rail 29 are formed at top and underside of the slot 25 respectively.

In the invention, the sliding cover 30 is a flat member and is sized to slidably cover an opening of one of the connections. In the embodiment, the sliding cover 30 is adapted to cover an opening of the slot 25 by sliding. A plurality of latches 31 (two are shown) are formed on a top edge of the sliding cover 30 and a slide 32 is formed on a bottom edge thereof. The slide 32 is extended toward the connections (see FIG. 3). The sliding cover 30 has its latches 31 slidably secured to the groove 28. The slide 32 is adapted to slidably receive the rail 29. This completes the assembly of the sliding cover 30. In operation, the sliding cover 30 is adapted to transversely slide along the groove 28 on the front panel of the case 21 for covering the opening of the slot 25 or not.

In the invention a protuberance 211 (see FIG. 2) is formed on the front panel of the case 21 proximate the connections (i.e., spaced from one side of the slot 25 in the embodiment).

Two spaced projections 301 are formed on the sliding cover 30 facing the protuberance 211. Either projection 301 is adapted to lockingly engage the protuberance 211 when the sliding cover 30 is disposed either in a position to cover the slot 25 or in a position to expose the slot 25 by sliding.

Also, in the invention a protrusion 302 is formed under either latch 31 (see FIG. 2). The protrusions 302 are adapted to cooperate with the projections 301 such that a structural strength of the sliding cover 30 can be enhanced. Further, the projection 301 and the protrusion 302 can facilitate both grasping and then sliding of the sliding cover 30 by the hand.

Referring to FIG. 3, it is clear from the above configuration that after slidably securing the latches 31 of the sliding cover 30 to the groove 28 on the front panel of the case 21, the slide 32 slidably receives the rail 29 on the front panel of the case 21. This completes the assembly of the sliding cover 30. As shown in FIG. 3, the assembled sliding cover 30 has slid to open the slot 25 so that a memory card can be inserted into the slot 25.

Figure 4:
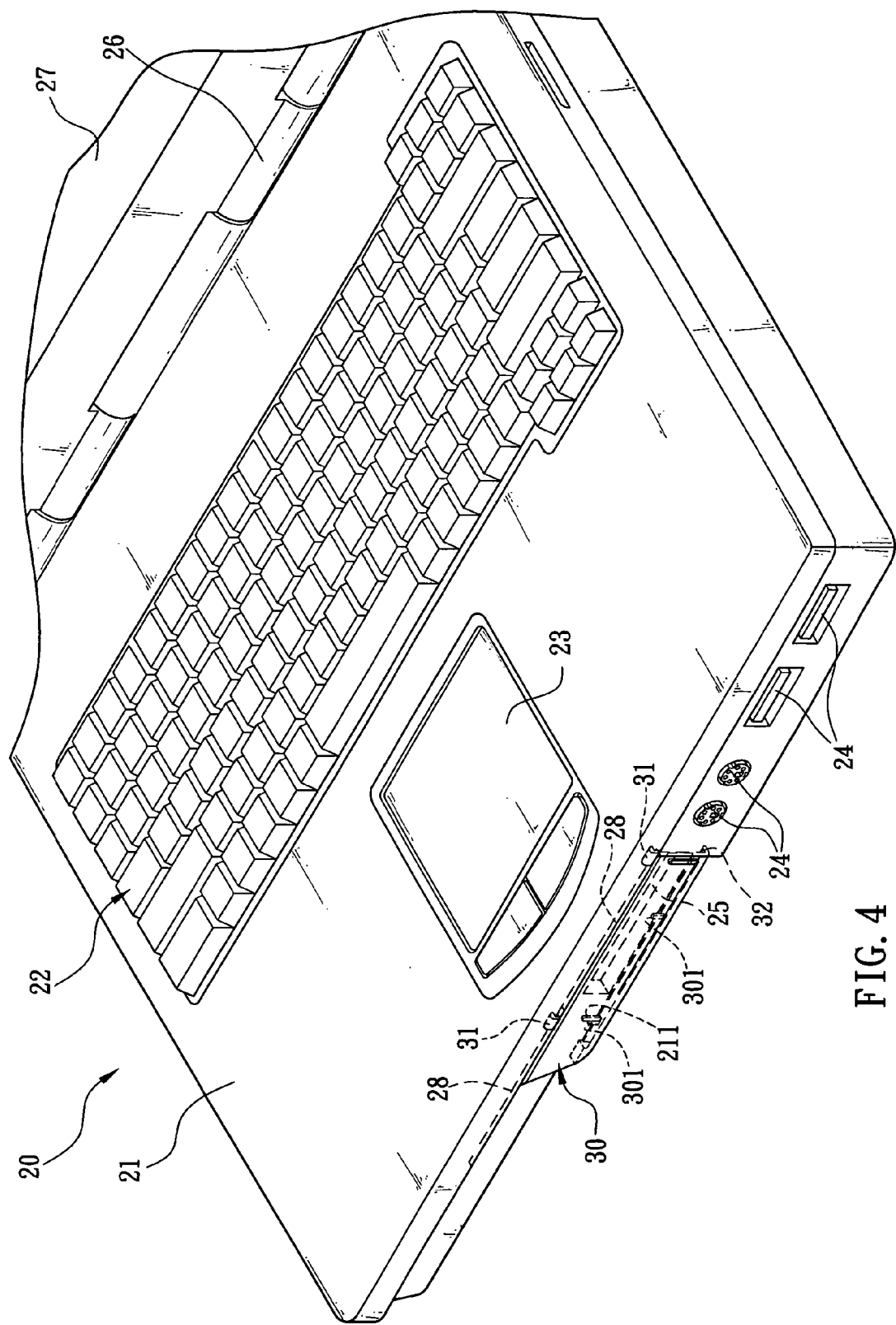

Referring to FIG. 4, a user may slide the sliding cover 30 rightward along the slot 25 when the slot 25 is not used in which the latches 31 and the slide 32 of the sliding cover 30 can close the opening of the slot 25 as guided by the groove 28 and the rail 29. At the same time, the left projection 301 is adapted to lockingly engage the protuberance 211. The sliding cover 30 and the front panel of the case 21 are thus substantially matinly engaged so as to prevent dust, foreign objects, etc. from entering the slot 25 and thus prolong the useful life of the slot 25.

In addition, it is known that the design trend is to develop slim and compact notebooks. Also, the forming of the sliding cover 30 on the front panel of the case 21 only occupies a minimum space thereof. As a result, the manufacturing cost increase is a minimum and the connections (e.g., the slot 25) are well protected by the sliding cover 30 (i.e., dust and foreign objects are prevented from entering) when the notebook is not in an operating position. In other words, both advantages are obtained. Thus, by utilizing the invention, an aesthetic, durable, and well protected electronic device is formed. Also, the prior drawbacks such as exposed connection and the manufacturing cost increase and complicated construction due to the provision of a protection member are eliminated. In brief, the invention has a simple construction and a lower manufacturing cost and thus can increase competitiveness of the electronic device produced by the manufacturer in the market of the same type products. Thus, the invention is an ergonomic design.

While the invention herein disclosed has been described by means of specific embodiments, numerous modifications and variations could be made thereto by those skilled in the art without departing from the scope and spirit of the invention set forth in the claims.

What is claimed is:

1. An electronic device comprising:

a case including one or more connections disposed on a front panel thereof, a transverse groove formed along a shoulder of the front panel of the case and above one of the connections, and a transverse rail disposed on the front panel of the case and below one of the connections;

a sliding cover sized to slidably cover an opening of one of the connections, the sliding cover including a plurality of latches disposed on a top edge thereof, and a slide disposed on a bottom edge thereof, the slide extended toward the connections;

a protuberance formed on the front panel proximate to one side of the opening;

two projections disposed spaced apart on the sliding cover facing the protuberance, the projections being configured such that one projection lockingly engages the protuberance when the sliding cover is disposed in a first position wherein the sliding cover covers the opening and the other projection lockingly engages the protuberance when the sliding cover is in a second position wherein the opening is exposed, and a protrusion disposed under either latch, and wherein the protrusions are adapted to cooperate with the projections such that a structural strength of the sliding cover can be enhanced, and the projection and the protrusion are adapted to facilitate grasping and sliding of the sliding cover by the hand;

wherein the latches are slidably secured to the groove, the slide is adapted to slidably receive the rail for completing an assembly of the sliding cover, and the sliding cover is adapted to transversely slide along the groove for covering or exposing the opening; and wherein one of the connections is a slot adapted to receive an inserted memory card having a conformed size.

* * * * *